(12) United States Patent
Nakatani

(10) Patent No.: US 7,643,668 B2
(45) Date of Patent: Jan. 5, 2010

(54) WORKPIECE INSPECTION APPARATUS, WORKPIECE INSPECTION METHOD AND COMPUTER-READABLE RECORDING MEDIUM STORING PROGRAM

(75) Inventor: Yuichi Nakatani, Kanagawa (JP)

(73) Assignee: Advanced Mask Inspection Technology Inc., Kawasaki-shi (JP)

( * ) Notice: Subject to any disclaimer, the term of this patent is extended or adjusted under 35 U.S.C. 154(b) by 687 days.

(21) Appl. No.: 11/299,847

(22) Filed: Dec. 13, 2005

(65) Prior Publication Data

US 2007/0071308 A1  Mar. 29, 2007

(30) Foreign Application Priority Data

Sep. 26, 2005  (JP) .............................. 2005-277774

(51) Int. Cl.
  *G06K 9/62* (2006.01)
  *G06K 9/00* (2006.01)
  *G06K 9/38* (2006.01)
(52) U.S. Cl. ..................... 382/149; 382/168; 382/172
(58) Field of Classification Search ......... 382/141–146, 382/154, 151; 250/306, 307, 310; 356/237.1, 356/237.5, 239.1
See application file for complete search history.

(56) References Cited

U.S. PATENT DOCUMENTS 6,137,541 A * 10/2000 Murayama ................. 348/673
6,873,720 B2 * 3/2005 Cai et al. ................... 382/149
6,895,108 B2 * 5/2005 Kim ........................... 382/145
6,993,183 B2 * 1/2006 Inoue ......................... 382/170
7,027,635 B1 * 4/2006 Wihl et al. .................. 382/144
7,043,071 B2 * 5/2006 Qian et al. .................. 382/144
7,330,581 B2 * 2/2008 Ishikawa .................... 382/145
7,379,580 B2 * 5/2008 Levin et al. ................ 382/149
2005/0013475 A1 * 1/2005 Levin et al. ................ 382/145

FOREIGN PATENT DOCUMENTS

| JP | 8-76359      | 3/1996  |
| JP | 11-132743    | 5/1999  |
| JP | 2000-348177  | 12/2000 |
| JP | 2002-203233  | 7/2002  |
| JP | 2004-177397  | 6/2004  |

* cited by examiner

*Primary Examiner*—Anand Bhatnagar
*Assistant Examiner*—Andrae S Allison
(74) *Attorney, Agent, or Firm*—Oblon, Spivak, McClelland, Maier & Neustadt, L.L.P.

(57) ABSTRACT

A workpiece inspection apparatus includes a search unit for finding from an input reference image a first pixel group which contains a certain pixel and a second pixel group having grayscale values within a threshold, and a probability acquisition unit responsive to receipt of an optical image of a workpiece being tested and the reference image, for obtaining a probability value based on a grayscale value of the certain pixel, a grayscale value of its corresponding pixel in the second pixel group, a grayscale value of an optical image pixel corresponding to the certain pixel, and a grayscale value of an optical image pixel corresponding to a pixel in the second pixel group corresponding to the certain pixel. The probability value is used to determine whether a defect exists at the optical image pixel corresponding to the certain pixel.

8 Claims, 11 Drawing Sheets

10: Ref Image

| y\x | 78 | 79 | 80 | 81 | 82 | 83 | 84 | 85 | 86 | 87 | 88 | 89 | 90 | 91 | 92 | 93 | 94 |
|---|---|---|---|---|---|---|---|---|---|---|---|---|---|---|---|---|---|
| 302 | 113 | 87 | 71 | 64 | 70 | 110 | 161 | 190 | 197 | 197 | 197 | 195 | 194 | 192 | 191 | 190 | 187 |
| 303 | 169 | 145 | 118 | 101 | 111 | 146 | 180 | 193 | 195 | 198 | 198 | 198 | 197 | 195 | 193 | 192 | 191 |
| 304 | 188 | 184 | 172 | 160 | 164 | 178 | 190 | 194 | 195 | 197 | 198 | 198 | 199 | 198 | 196 | 196 | 193 |
| 305 | 175 | 183 | 188 | 188 | 188 | 190 | 193 | 194 | 196 | 198 | 198 | 198 | 198 | 198 | 197 | 197 | 197 |
| 306 | 130 | 153 | 173 | 184 | 190 | 190 | 192 | 196 | 197 | 198 | 197 | 198 | 199 | 196 | 197 | 199 | 188 |
| 307 | 75 | 95 | 124 | 153 | 173 | 186 | 192 | 194 | 195 | 197 | 198 | 197 | 198 | 197 | 196 | 195 | 169 |
| 308 | 58 | 60 | 71 | 95 | 124 | 153 | 176 | 189 | 194 | 195 | 196 | 197 | 197 | 196 | 198 | 187 | 145 |
| 309 | 63 | 60 | 56 | 59 | 70 | 95 | 124 | 154 | 176 | 190 | 194 | 196 | 196 | 196 | 196 | 183 | 137 |
| 310 | 60 | 60 | 61 | 60 | 57 | 59 | 71 | 95 | 124 | 154 | 176 | 189 | 194 | 195 | 195 | 185 | 153 |
| 311 | 75 | 63 | 59 | 60 | 61 | 60 | 56 | 59 | 71 | 95 | 126 | 154 | 177 | 187 | 191 | 191 | 180 |
| 312 | 128 | 99 | 75 | 61 | 58 | 59 | 61 | 60 | 58 | 59 | 71 | 95 | 126 | 153 | 173 | 185 | 190 |
| 313 | 176 | 157 | 128 | 97 | 75 | 61 | 58 | 60 | 61 | 61 | 58 | 59 | 72 | 93 | 123 | 151 | 172 |
| 314 | 186 | 185 | 175 | 156 | 127 | 98 | 74 | 60 | 58 | 60 | 62 | 60 | 59 | 59 | 71 | 93 | 122 |
| 315 | 160 | 176 | 185 | 184 | 176 | 155 | 127 | 96 | 73 | 60 | 58 | 60 | 63 | 61 | 58 | 59 | 71 |
| 316 | 108 | 136 | 161 | 177 | 184 | 184 | 176 | 154 | 126 | 97 | 75 | 62 | 58 | 60 | 62 | 60 | 58 |
| 317 | 65 | 81 | 107 | 137 | 162 | 177 | 185 | 185 | 175 | 158 | 131 | 101 | 77 | 62 | 58 | 60 | 62 |
| 318 | 59 | 58 | 65 | 83 | 110 | 144 | 173 | 187 | 190 | 188 | 181 | 161 | 132 | 101 | 74 | 60 | 58 |

FIG.8

20: Ref Image

| y\x | 78 | 79 | 80 | 81 | 82 | 83 | 84 | 85 | 86 | 87 | 88 | 89 | 90 | 91 | 92 | 93 | 94 |
|---|---|---|---|---|---|---|---|---|---|---|---|---|---|---|---|---|---|
| 302 | 115 | 92 | 73 | 67 | 74 | 114 | 164 | 188 | 191 | 191 | 195 | 194 | 193 | 191 | 192 | 190 | 189 |
| 303 | 169 | 150 | 125 | 110 | 118 | 154 | 180 | 191 | 193 | 192 | 194 | 195 | 192 | 193 | 192 | 191 | 192 |
| 304 | 189 | 187 | 181 | 169 | 170 | 178 | 189 | 192 | 191 | 193 | 194 | 196 | 194 | 192 | 195 | 193 | 193 |
| 305 | 181 | 188 | 193 | 193 | 190 | 189 | 189 | 192 | 192 | 191 | 194 | 194 | 194 | 194 | 194 | 194 | 194 |
| 306 | 140 | 160 | 179 | 188 | 192 | 194 | 191 | 194 | 193 | 192 | 195 | 192 | 195 | 197 | 194 | 196 | 191 |
| 307 | 79 | 101 | 130 | 156 | 177 | 191 | 194 | 193 | 195 | 194 | 192 | 192 | 193 | 197 | 196 | 197 | 174 |
| 308 | 56 | 60 | 74 | 97 | 126 | 158 | 182 | 188 | 191 | 193 | 193 | 193 | 193 | 193 | 194 | 191 | 149 |
| 309 | 61 | 58 | 57 | 59 | 71 | 97 | 130 | 153 | 170 | 185 | 192 | 195 | 195 | 193 | 192 | 182 | 136 |
| 310 | 59 | 60 | 61 | 60 | 58 | 59 | 72 | 90 | 112 | 142 | 171 | 190 | 195 | 196 | 193 | 185 | 151 |
| 311 | 75 | 62 | 59 | 61 | 61 | 59 | 58 | 58 | 65 | 83 | 120 | 154 | 179 | 192 | 193 | 191 | 178 |
| 312 | 130 | 99 | 74 | 61 | 58 | 60 | 62 | 62 | 60 | 59 | 70 | 95 | 129 | 159 | 178 | 187 | 189 |
| 313 | 176 | 158 | 129 | 98 | 74 | 62 | 58 | 61 | 63 | 61 | 58 | 61 | 74 | 98 | 128 | 158 | 177 |
| 314 | 184 | 185 | 176 | 158 | 128 | 97 | 75 | 63 | 59 | 60 | 62 | 61 | 58 | 61 | 74 | 99 | 129 |
| 315 | 160 | 179 | 185 | 186 | 176 | 156 | 132 | 100 | 75 | 62 | 59 | 61 | 62 | 61 | 57 | 59 | 72 |
| 316 | 106 | 140 | 163 | 176 | 185 | 189 | 178 | 156 | 128 | 101 | 75 | 62 | 60 | 61 | 62 | 60 | 57 |
| 317 | 62 | 82 | 108 | 138 | 163 | 182 | 188 | 187 | 178 | 158 | 129 | 100 | 75 | 61 | 59 | 61 | 62 |
| 318 | 59 | 57 | 63 | 82 | 114 | 150 | 178 | 188 | 189 | 187 | 177 | 158 | 128 | 97 | 73 | 62 | 59 |

FIG.9

Model of Observed Graytone Value Y $$Y = X + (aX+b)\varepsilon_1 + \varepsilon_2$$

⇩

$$h = \frac{\sum \{g(x,y) - f(x,y)\}^2}{\{a \cdot f(P_x, P_y) + b\}^2}$$

Output Probability with Sample Value ($\leq h$) of $\chi^2$ distribution with freedom degree k

↓

Probability Value

FIG. 10

WORKPIECE INSPECTION APPARATUS, WORKPIECE INSPECTION METHOD AND COMPUTER-READABLE RECORDING MEDIUM STORING PROGRAM

CROSS-REFERENCE TO RELATED APPLICATION

This application is based upon and claims the benefit of priority from prior Japanese Patent Application No. 2005-277774, filed on Sep. 26, 2005, the entire contents of which are incorporated herein by reference.

BACKGROUND OF THE INVENTION

1. Field of the Invention

The present invention relates generally to workpiece inspection technologies and, more particularly, to pattern inspection techniques for inspecting a workpiece for defects, which is for use in semiconductor fabrication. This invention also relates to a method and apparatus for inspecting lithography masks for defects, which are for use in the manufacture of semiconductor devices and liquid crystal display (LCD) panels.

2. Related Art

In recent years, with the quest for higher integration and larger capacity of large-scale integrated (LSI) circuits, semiconductor devices are becoming narrower in circuit linewidth required. These semiconductor devices are fabricated by using an original or "master" plate with a circuit pattern formed thereon (also called a photomask or a reticle as will be generically referred to as a mask hereinafter) in a way such that the pattern is exposure-transferred by reduced projection exposure equipment, known as a stepper, onto a target wafer to thereby form thereon a circuit. Hence, for the manufacture of a mask to be used to transfer such ultrafine circuit pattern onto wafers, pattern photolithography equipment is used, which is capable of "drawing" microcircuit patterns. Such pattern exposure equipment is also employable in some cases to directly draw or "image" a circuit pattern onto wafers. As for the pattern exposure equipment, an attempt is made to develop exposure tools using an electron beam or laser beam.

Improving manufacturing yields is inevitable for the microfabrication of LSI chips which entail increased production costs. Currently, circuit patterns of LSIs, such as 1-giga-bit class dynamic random access memories (DRAMs), are becoming on the order of nanometers (nm), rather than submicron order. One major factor for reducing yields must be pattern defects of a mask as used when an ultrafine pattern is exposed and transferred onto semiconductor wafers by photolithography techniques. As LSI patterns to be formed on semiconductor wafers are further miniaturized in recent years, the size dimensions that must be detected as pattern defects became much smaller than ever before. Thus, a need is felt to achieve further increased accuracy of the pattern inspection apparatus operable to inspect the LSI fabrication-used pattern-transfer mask for defects.

Incidentally, with recent advances in multimedia technologies, LCD panels are becoming larger in substrate size, up to 500 mm×600 mm or more, and finer in pattern of thin film transistors (TFTs) as formed on liquid crystal substrates. This larger/finer trend requires an ability to inspect ultrasmall pattern defects in a wide range. For this reason, it is an urgent challenge to develop an advanced workpiece inspection apparatus capable of efficiently inspecting defects of photomasks in a short time period, which are for use in the manufacture of such large-area LCD patterns and large-screen LCD panels.

Here, in currently available pattern inspection tools, it is known to perform inspection by comparing the optical image of a pattern on a workpiece, such as a lithography mask or else, which image is sensed by using a magnifying optical system at a specified magnification, to either design data or a sensed optical image of an identical pattern on the workpiece. This approach is disclosed, for example, in JP-A-8-76359.

Examples of pattern inspection methodology include a "die to die" inspection method and a "die to database" inspection method. The die-to-die inspection is for comparing together optical images as sensed from identical pattern elements at different locations on the same mask. The die-to-database inspection is usually performed using an exposure device for drawing or "imaging" a pattern on a mask and an inspection device. Typically this inspection has the steps of receiving computer-aided design (CAD) data indicative of a designed pattern, converting the CAD data to pattern draw data having a format appropriate for data input to the imaging device, inputting the converted data to the inspection device, causing it to generate a reference image based thereon, receiving measured data indicative of the optical image of a pattern under testing as obtained by pickup of this pattern, and then comparing the optical image to the reference image to thereby inspect the under-test pattern for defects. The inspection method for use in such apparatus, the workpiece is mounted on a stage, which moves to permit light rays to scan a surface of the workpiece for execution of the intended inspection. A light source and its associated illumination optical lens assembly are used to emit and guide the light to fall onto the workpiece. The light that passed through the workpiece or reflected therefrom travels via the optics to enter a sensor so that a focussed optical image is formed thereon. This optical image is sensed by the sensor and then converted to electrical measurement data, which will be sent to a comparator circuit. After position-alignment between images, the comparator circuit compares the measured data to reference image data in accordance with an adequate algorithm. If these fail to be matched, then determine that pattern defects are present.

As previously stated, with the growing quest for highly miniaturized workpiece patterns, a need is felt to accurately detect ultrafine defects, which are small in size enough to be "buried" in pixel position deviations, image expansion/shrink, swell and sensing noises of those images to be compared together. To meet the need, a high-reliability comparison inspection technique is desired.

A known approach to detecting ultrafine defects residing at pattern edges in the case of comparing an optical image to reference image is to extract contour lines for comparison. Examples of it are disclosed, for example, in JP-A-11-132743 and JP-A-2002-203233. Other known approaches include the use of a method of detecting defects while combining together a plurality of predetermined filters in a way pursuant to specific shapes, such as horizontal and/or vertical edge shapes.

Unfortunately, the prior art approaches are encountered with the difficulty in accurately extracting, with increased stability, contour lines from optical images which can contain various kinds of noises. Another difficulty lies in the lack of an ability to offer detectability against gently sloped edge portions having hardly specifiable contour lines and mere "painted" portions within patterns, which come with inherently unidentifiable contour lines. Additionally in the case of using "inflexible" filters designed for exclusive use with predefined shapes only, inspection-applicable pattern shapes must be limited. Although in this filtering scheme the so-called differential (difference) computation is often employed, it remains difficult to obtain an accurate differential (difference) value from those edges having complicated profile shapes.

As apparent from the foregoing, the prior known schemes for comparing an optical image to a reference image using a filter which is exclusively fitted to contour lines and/or specific shapes are encountered with problems as to the lack of supportabilities to comparison at those edges with various angles and edges having complicated profiles. Another problem faced with the prior art lies in the difficulty in handling mere "painted" portions inside of inherently contour-unidentifiable patterns and gently sloped edges with their contour lines being rarely identifiable.

BRIEF SUMMARY OF THE INVENTION

It is therefore an object of this invention to provide a method and apparatus for inspecting a workpiece for defects by comparing an optical image to a reference image, which are capable of avoiding the problems in the prior art and offering increased reliability.

In accordance with one aspect of the invention, a workpiece inspection apparatus includes a search unit operatively responsive to input of a reference image for searching the input reference image for a first group of pixels containing therein a certain pixel and a second group of pixels having grayscale values within a predetermined threshold, a probability acquisition unit responsive to receipt of an optical image of a workpiece being tested and the reference image for acquiring a probability value based on a grayscale value of said certain pixel in said reference image and a grayscale value of a pixel corresponding to the certain pixel in the second pixel group searched along with a grayscale value of a pixel of the optical image corresponding to the certain pixel in the reference image and a grayscale value of a pixel of the optical image corresponding to a pixel in the second pixel group corresponding to the certain pixel, and a determination unit which uses the probability value to determine whether more than one defect is present or absent at the pixel of the optical image corresponding to the certain pixel.

In accordance with another aspect of the invention, a workpiece inspection method includes, upon input of a reference image, searching the input reference image for a first group of pixels containing therein a certain pixel and a second group of pixels having grayscale values within a predetermined threshold, acquiring, when receiving an optical image of a workpiece being tested and the reference image, a probability value based on a grayscale value of the certain pixel in the reference image and a grayscale value of a pixel corresponding to the certain pixel in the second pixel group searched along with a grayscale value of a pixel of the optical image corresponding to the certain pixel in the reference image and a grayscale value of a pixel of the optical image corresponding to a pixel in the second pixel group corresponding to the certain pixel, and using the probability value to determine whether more than one defect is present or absent at the pixel of the optical image corresponding to the certain pixel.

In accordance with a further aspect of the invention, a computer-readable recording medium storing therein a software program for causing computers to execute a pixel defect detection process for workpiece pattern inspection is provided. This process includes the steps of storing in a first storage device a reference image of a workpiece being tested, reading out of the first storage device the reference image to search this reference image for a first group of pixels containing therein a certain pixel and a second group of pixels having grayscale values within a predetermined threshold, storing in a second storage device an optical image of the workpiece being tested, reading out of the second storage device the optical image to acquire a probability value based on a grayscale value of the certain pixel in the reference image and a grayscale value of a pixel corresponding to the certain pixel in the second pixel group searched along with a grayscale value of a pixel of the optical image corresponding to the certain pixel in the reference image and a grayscale value of a pixel of the optical image corresponding to a pixel in the second pixel group corresponding to the certain pixel, and using the probability value to determine whether more than one defect is present or absent at the pixel of the optical image corresponding to the certain pixel.

BRIEF DESCRIPTION OF THE DRAWINGS

FIG. 8 is a diagram showing one example of search results of identical vicinal patterns.

FIG. 9 is a diagram showing an example of optical image data corresponding to the search result of FIG. 8.

FIG. 10 is a conceptual diagram for explanation of a variation evaluating scheme.

DETAILED DESCRIPTION OF THE INVENTION

As previously stated, the pattern defect inspection method is generically classified into two schemes: die-to-die (DD) comparison, and die-to-database (DB) comparison. The DD comparison is a method for detecting defects by comparing two dies on a reticle, whereas the DB comparison is a method of detecting defects by comparing a die to a database which is created from graphics data obtainable by conversion of CAD data for LSI design use. In the rest of the description, one of the two dies in the DD comparison which is for use as an object to be inspected will be referred to as an optical image, while the other for use as a reference image will be called a reference image. Additionally the die image in the DB comparison will be referred to as the optical image, and the database as the reference image.

Embodiment 1

In an embodiment 1, an approach to inspecting a workpiece by the DB comparison will be mainly explained with reference to some of the accompanying drawings below.

Figure 1:
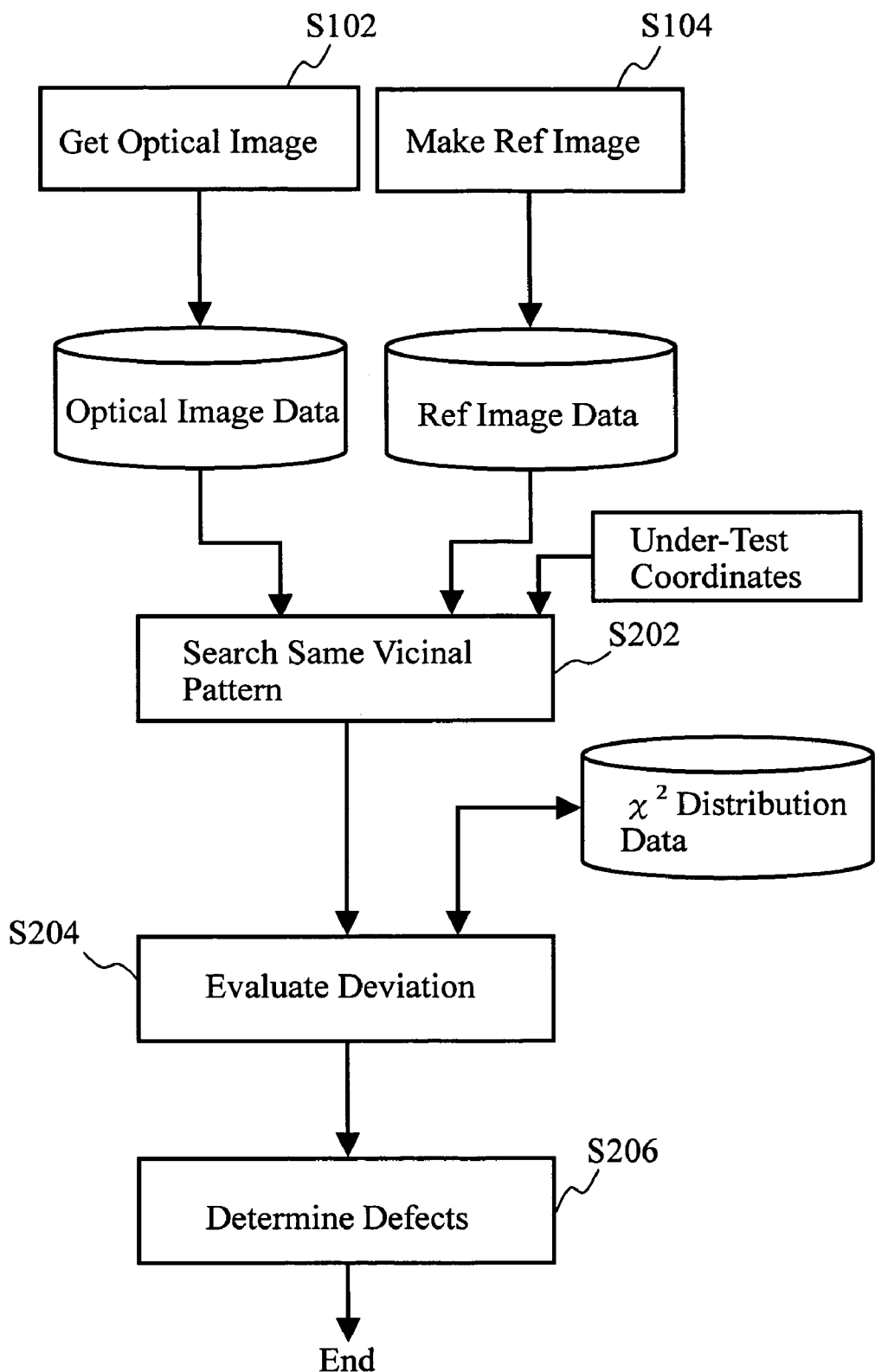
FIG. 1 is a flow diagram showing exemplary main process steps of a workpiece inspection method in accordance with an embodiment 1 of the invention.

FIG. 1 is a flowchart showing main process steps of a workpiece inspection method in accordance with the embodiment 1.

In FIG. 1, the workpiece inspection method has a series of steps, including an optical image acquisition step S102, a reference image creation step S104, an identical vicinal pattern search step S202, a variation evaluation step s204 which is one example of the probability acquisition step as claimed, and a defect determination or "judgment" step S206.

Figure 2:
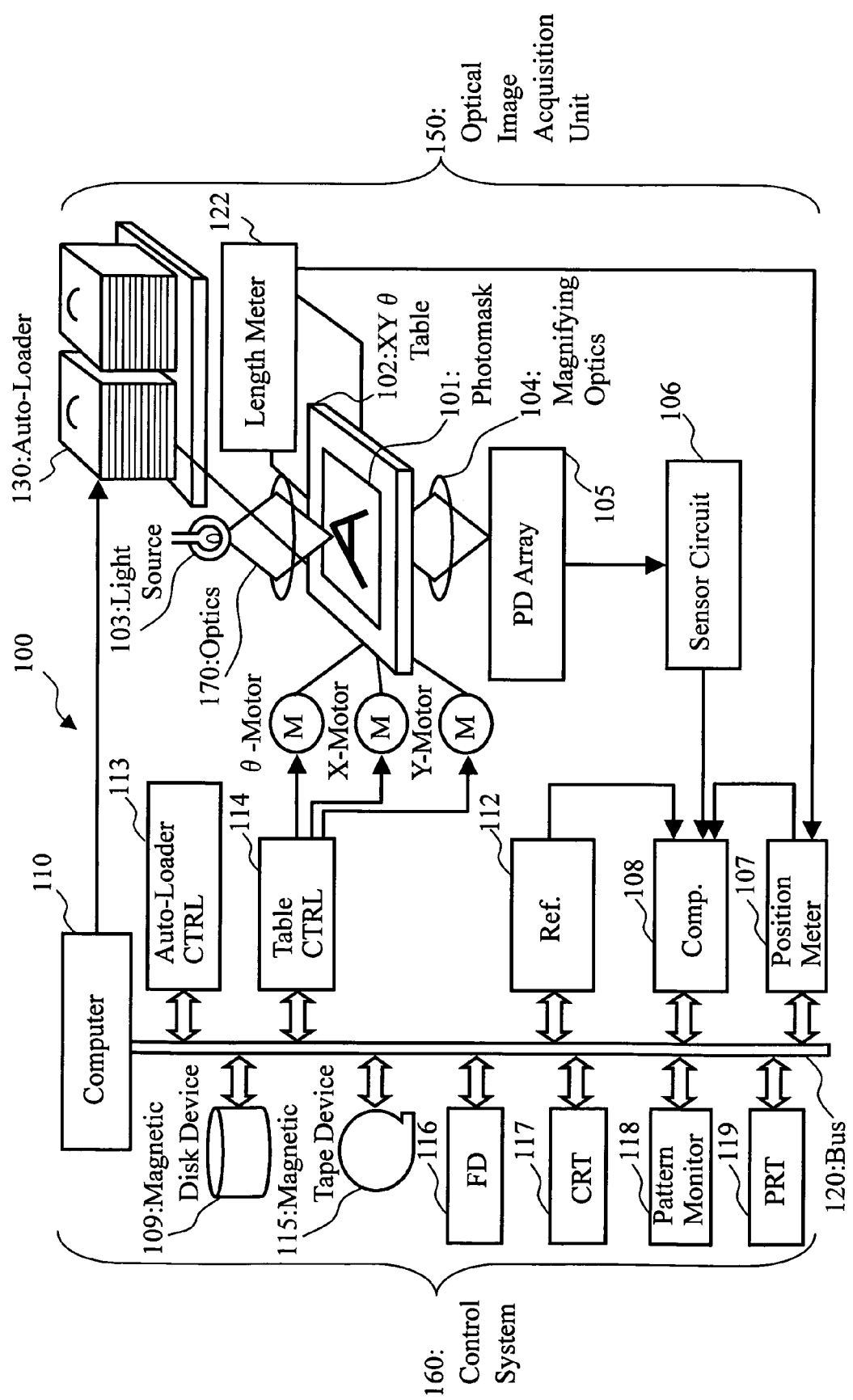
FIG. 2 is a diagram schematically showing an internal configuration of a workpiece inspection apparatus in the embodiment 1.

See FIG. 2, which shows an internal configuration of a workpiece inspection apparatus 100 in the embodiment 1.

In FIG. 2, the workpiece inspection apparatus 100 is the one that inspects a workpiece for defects. A typical example of the workpiece is a substrate under manufacture, such as a photomask or wafer or else. The inspection apparatus 100 is generally made up of an optical image acquisition unit 150 and control circuitry 160. The optical image acquisition unit 150 includes an XYθ-axis table 102, light source 103, magnifying optical lens assembly 104, photodiode (PD) array 105, sensor circuit 106, laser-assisted length measurement system as will be referred to hereinafter as laser length meter 122, automatic loader mechanism 130, and illumination optics 170. The control circuitry 160 includes a computer 110 acting as a system controller. This control computer 110 is operatively connected via a data transmission bus 120 to a position circuit 107, a comparison circuit 108 which is an example of the comparison unit as claimed, a reference image creation circuit 112, an auto-loader control circuit 113, a table control circuit 114, a magnetic disk device 109 which is one example of the storage device, a magnetic tape device 115, a flexible disk (FD) device 116, a cathode ray tube (CRT) display 117, a pattern monitor 118, and a printer 119. The XYθ table 102 is driven by an X-axis motor, Y-axis motor and θ-axis motor. Note here that in FIG. 2, illustration of those parts or components other than the constituent members required for the explanation of this embodiment 1 is eliminated. It would readily occur to skilled persons that the workpiece inspection apparatus 100 is usually designed, for practical implementation, to include such other necessary arrangements.

Figure 3:
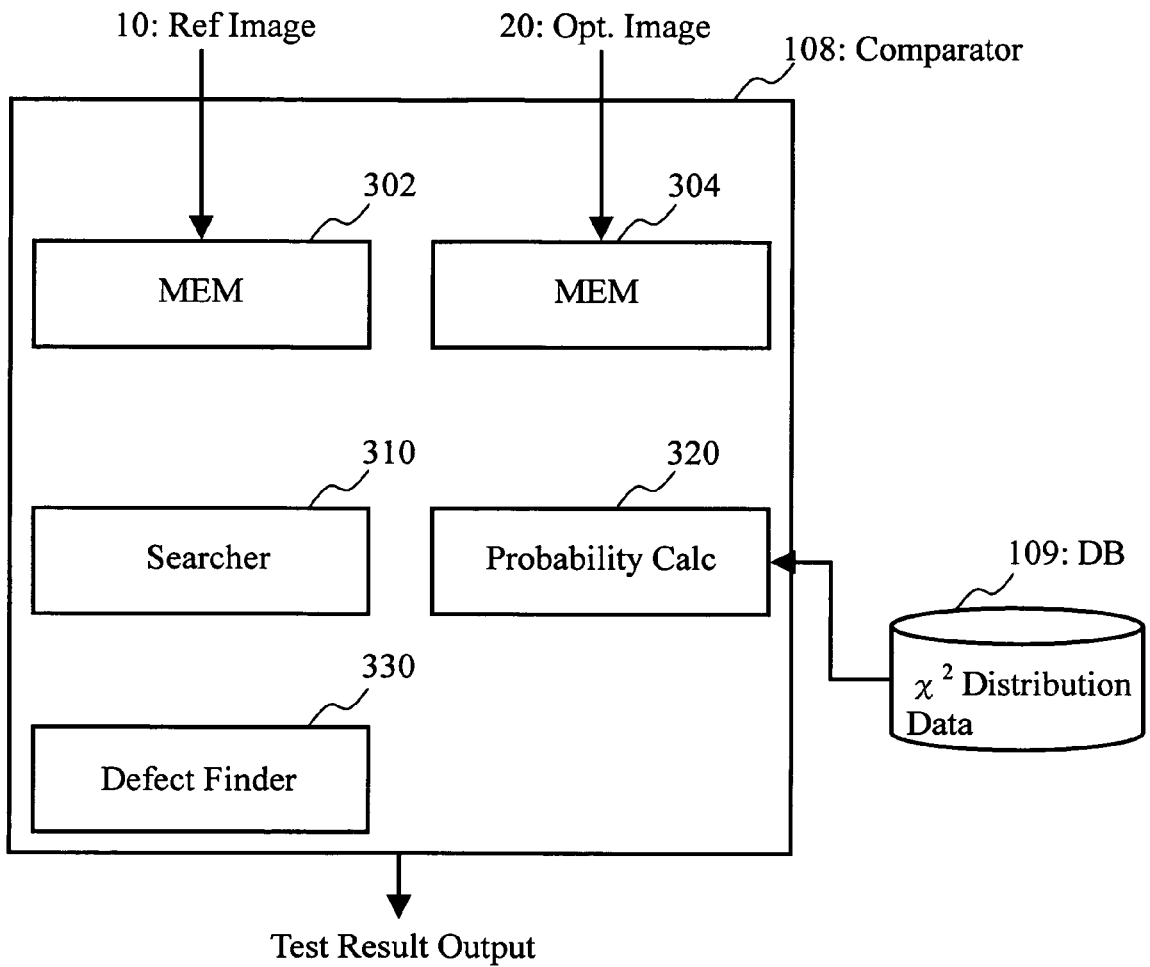
FIG. 3 is a diagram showing an exemplary configuration of a comparison circuit.

FIG. 3 shows an exemplary configuration of the comparison circuit 108.

In FIG. 3, the comparator circuit 108 has a reference image data memory 302 which is an example of the storage device, an optical image data memory 304 that is an example of the storage device, an identical vicinal pattern searching circuit 310 which exemplifies the search unit, a probability calculation circuit 320 for use as an example of the probability acquisition unit, and a defect judgment circuit 330 that is an example of the determination unit.

At the optical image acquisition step S102 shown in FIG. 1, the optical image acquisition unit 150 acquires, based on the design data (graphics data), an optical image (measured data) of the photomask 101 for use as a workpiece on which drawn are graphic forms indicated by the graphics data contained in the design data. More specifically the optical image is obtained in a way which follows.

The photomask 101, i.e., the workpiece being tested, is mounted on the movable XYθ table 102, which is driven by respective X, Y, and θ-axis motors to move in horizontal and rotation directions. Then, the appropriate light source 103 overlying the XYθ table 102 emits light, which is guided to fall onto a pattern as formed on the photomask 101. Light rays leaving the light source 103 travel via the illumination optics 170 to hit the photomask 101, i.e., workpiece. The magnifier optics 104, PD array 105 and sensor circuit 106 are disposed to underlie photomask 101 whereby the light that passed through photomask 101, i.e., workpiece such as an exposure mask, progresses and reaches PD array 105 so that a focused pattern image is formed thereon. Magnifier optics 104 may be designed so that focussing adjustment is automated by an automatic focusing mechanism (not shown).

Figure 4:
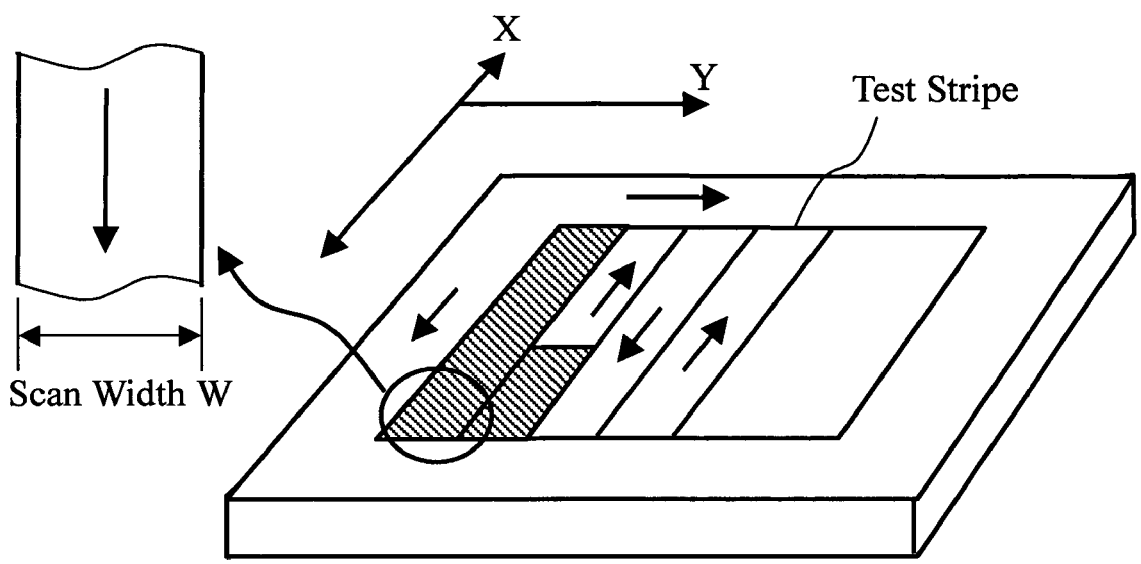
FIG. 4 is a diagram for explanation of an optical image acquisition procedure.

FIG. 4 is a diagram for explanation of an optical image acquisition procedure.

As shown in FIG. 4, a workpiece surface area under inspection is virtually subdivided along the Y direction into a plurality of narrow, elongate test strips each having a scan width W. The XYθ table 102 is motion-controlled to permit respective divided test strips to be scanned continuously so that an optical image is acquired during movement in the X direction. The PD array 105 is operable to seamlessly input images of the scan width W such as shown in FIG. 4. Then, after having captured the image of a first test strip, obtain the image of a second test strip while moving in the opposite direction in this event so that an image of scan width W is input in a similar way. Next, in the case of getting the image of a third test strip, image capturing is done while moving in the direction opposite to that for acquisition of the second test strip image-namely, in the same direction as that for acquisition of the first test strip image. By continuously capturing images in this serpentine manner, it is possible to shorten wasteful processing times.

The image that is focussed on the PD array 105 is photoelectrically converted thereby and is then analog-to-digital (A/D) converted by the sensor circuit 106. PD array 105 has time-delay integrator (TDI) sensors installed. By causing the XYθ table 102 for use as a workpiece support stage to move continuously in the X-axis direction, the TDI sensors pick up a circuit pattern of the photomask 101, i.e., workpiece being tested. The light source 103, magnifying optics 104, PD array 105 and sensor circuit 106 make up a high-power inspection optical system.

The XYθ table 102 is driven by the table control circuit 114 under control of the control computer 110. Table 102 is movable by a drive system such as three-axis (X-Y-θ) motors for driving it in the X, Y and θ directions. Examples of these X, Y and θ motors are stepper motors. A moved position of XYθ table 102 is measured by the laser-aided length measurement system 122 to generate a measurement signal, which is supplied to the position circuit 107. The photomask 101 on XYθ table 102 is automatically transported from the auto-loader 130 that is driven by the auto-loader control circuit 113 and is then automatically educed after completion of the inspection.

Measurement data (optical image data) as output from the sensor circuit 106 is sent forth toward the data distribution processor circuit 140 along with output data of the position circuit 107 indicative of a present position of the photomask 101 on XYθ table 102. The measured data may be 8-bit signless data representing the gradation or "tone" of the brightness of each pixel.

At reference image creation step S104 of FIG. 1, the control circuit 160 uses the design data (graphics data) to create a reference image for comparison with the optical image (measured data) of the photomask 101, i.e., the workpiece on which drawn are the graphic forms indicated by the graphics data contained in the design data. More specifically, the reference image is formed in a way which follows.

Firstly, at an expansion step, the reference image creator circuit 112 provides access to the magnetic disk device 109, which is an example of the storage device (storage unit), and reads therefrom design data through the control computer 110. Then, convert graphic forms that are contained in the read design data of photomask 101, i.e., workpiece, into two-value or multiple-value image data (design image data), which will be sent forth to the reference circuit 112.

Figure 5:
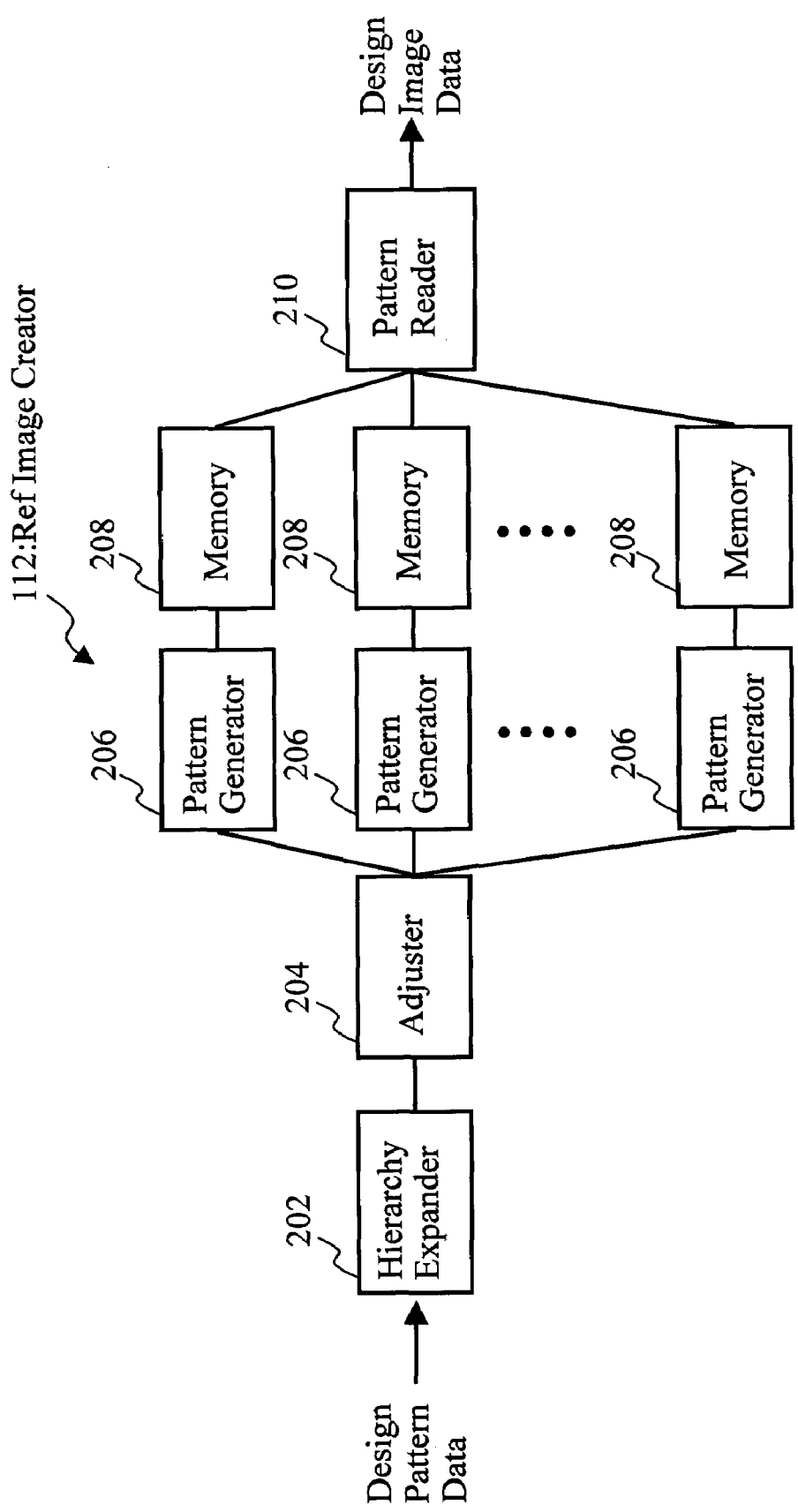
FIG. 5 is a diagram showing an exemplary arrangement of a reference image creation circuit.

FIG. 5 is a diagram showing an exemplary configuration of the reference image creator circuit 112.

In FIG. 5, the image creator 112 includes a hierarchical structure expansion circuit 202, an adjustment circuit 204, pattern generation circuits 206, pattern memories 208 and a pattern readout circuit 210. The pattern generators 206 and memories 208 are arranged so that a plurality of stages of pattern-generator/memory pairs are disposed.

Note here that the graphic forms as contained in the design data are with rectangles and triangles as the basic figures; for example, graphics data defining each pattern's shape, size, position and others are stored in the form of information items such as coordinates (x,y) at graphics standard positions, side edge lengths, graphic codes for use as identifiers which distinguish graphic species such as rectangles and triangles or else.

Upon input of such design pattern data for use as the graphics data to the reference image creator circuit 112, the hierarchical structure expansion circuit 202 expands the input data up to data items in units of graphic forms, and then interprets graphic sizes and graphic codes indicative of graphic shapes of the graphics data. Then, the pattern generator circuit 206 operates to expand two-value or multivalue design image data as a pattern to be disposed within a cell(s) with a grid of a specified quantization size being as a unit. The expanded design image data is temporarily stored in the pattern memory 208. In other words, the pattern generator 206, which exemplifies an occupation ratio computing unit, reads the design pattern data and computes the occupation ratio of a graphic form in the design pattern data per each cell, which is defined by virtual division or "dicing" of the test area with a die of a prespecified size as a unit, and then outputs resultant n-bit occupation ratio data to the pattern memory 208. A preferable example is that one die is set as a single pixel. Assuming that one pixel is designed to have a resolution of $1/2^8 (=1/256)$, compute an occupation ratio within the pixel while assigning thereto small regions of 1/256 in a way corresponding to the region of a graphic as disposed in the pixel. Then, output the result to pattern memory 208 as 8-bit occupation ratio data. Such the occupation ratio is for use as the gray-scale or "tone" value of each pixel.

Here, in order to permit the multiple pattern generator circuits 206 to effectively perform parallel processing operations, the adjustment circuit 204 distributes input data to each pattern generator 206. Then, the pattern reader 210 reads the occupation ratio data being stored in the pattern memory 208. At pattern reader 210, when the occupation ratio data within the same pixel are present, add them together for readout, whereby a graphic occupation ratio (grayscale value) within each pixel is identifiable.

In this way, the reference image creator circuit 112 creates the reference image to be compared with an optical image, from the design image data, i.e., graphics image data as sent thereto.

Then, at a comparison step, the comparator circuit 108 receives or "imports" an optical image which is the measured data of the pattern being tested as generated by the sensor circuit 106 based on the transmission image obtained from the photomask 101, i.e., workpiece, and the reference image that is the design data as generated at the reference image creator 112, and then compares them together in accordance with a prespecified algorithm to thereby determine or "judge" whether defects are present or absent. In this event, the comparator 108 first stores the presently accepted reference image data in the reference image data memory 302. Then, store the accepted optical image data in the optical image data memory 304.

Figure 6:
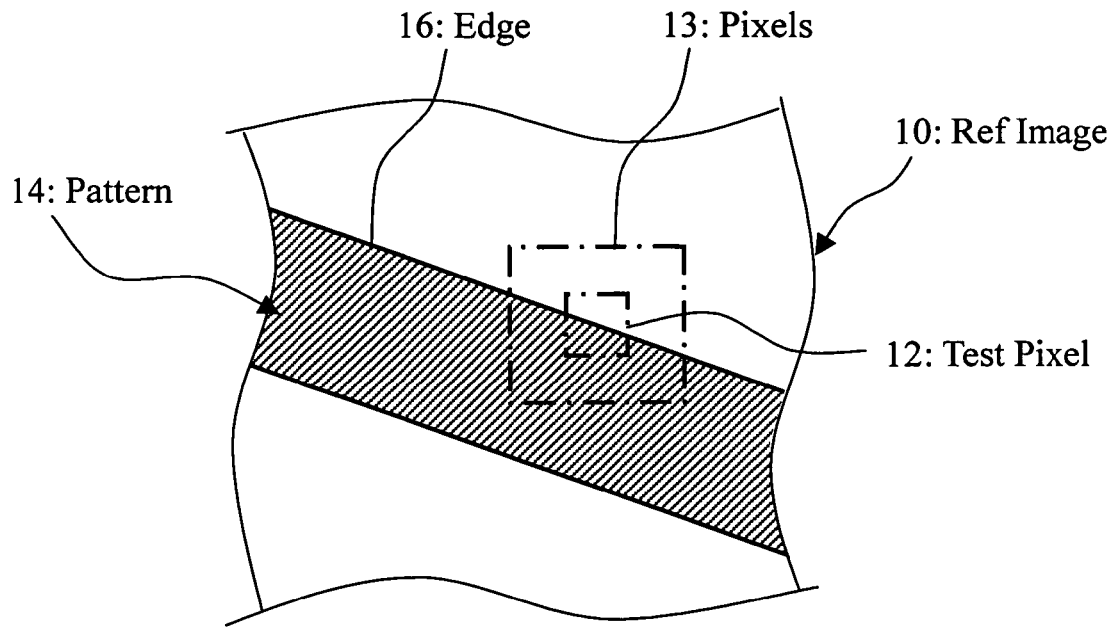
FIG. 6 is a diagram showing an exemplary reference image.

FIG. 6 depicts an example of the reference image.

This reference image 10 shown herein has a pattern element 14 with an edge 16. Suppose here that a portion of such image 10 on the pattern edge 16 is a target pixel 12 under inspection.

Figure 7:
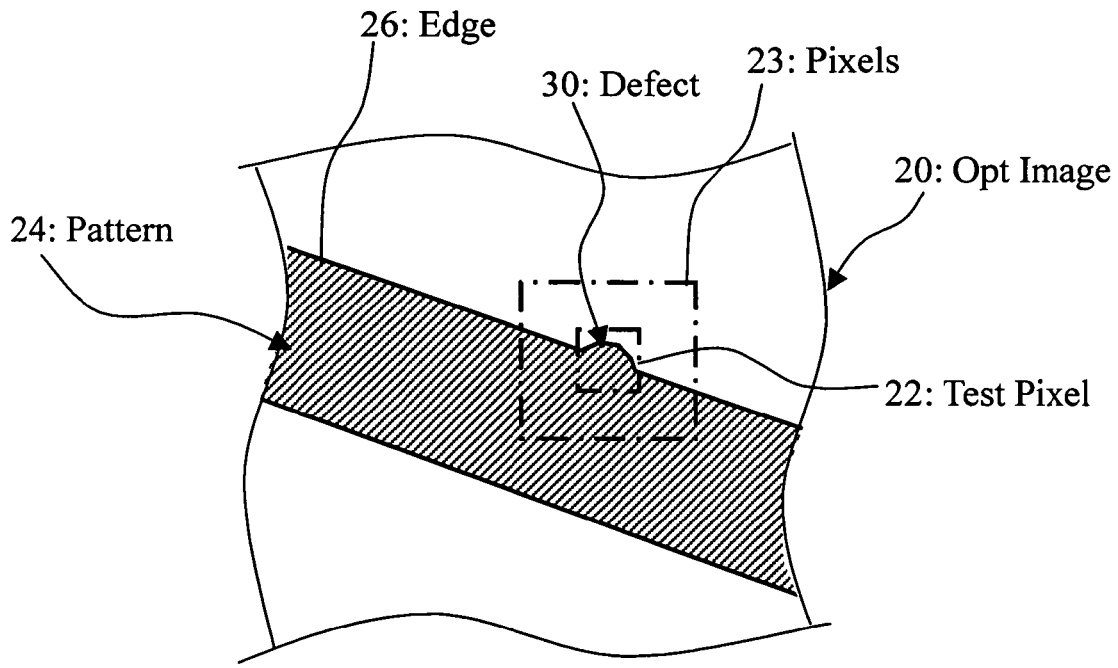
FIG. 7 is a diagram showing an exemplary optical image of a workpiece under inspection.

FIG. 7 shows an exemplary optical image.

Shown herein is an optical image 20 corresponding to the reference image 10 of FIG. 6. Here, a portion of the optical image 20 residing on an edge 26 of a corresponding pattern element 24 is regarded as a pixel 22 under test. Assume that this pixel 22 is associated with a defective portion 30 as shown in FIG. 7. A technique for inspecting the under-test pixel 22 for defects will be explained below.

At the identical vicinal pattern search step S202 of FIG. 1, the identical vicinal pattern searching circuit 310 receives the reference image 10 as read out of the memory 302, and then searches, from inside of the input reference image 10, a certain group of pixels 13 containing therein the under-test pixel 12 and a pixel group in close proximity thereto having grayscale values within a predetermined threshold, as an identical vicinal pattern.

One example of the identical vicinal pattern search result is shown in FIG. 8.

First, let the coordinates of the under-test pixel 12 be given as $(P_x, P_y)$. Here, a pixel with its coordinates (86, 310) having a grayscale value of "124" is regarded as the target pixel 12.

Then, specify a region or "block" of m rows and n columns of pixels with the coordinate point (x,y) as its center, which is then represented by f(x,y). Then, obtain all pixels (x,y) which satisfy the criteria of Equation 1; next, let them be a string of dots {Ai} (i=0, 1, 2, . . . , n, where n is an integer). The numbers m, n and threshold $th_1$ are predefined parameters; for example, m=n=3, $th_1$=16. Below is Equation 1.

$$\sum_{(P_x+V_x, P_y+V_y) \in N_{mn}(P_x, P_y)} |f(P_x + V_x, P_y + V_y) - f(x + V_x, +y + V_y)|$$

In the example of FIG. 8, a dot sequence given as {Ai}={ (82, 308), (84, 309), (86, 310), (88, 311), (90, 312)} is obtained. Briefly, while letting a matrix of 3×3 pixels with the target pixel coordinates $(P_x, P_y)$ as its center be a single pixel group 13, perform comparison with a group of 3×3 pixels residing near or around it with pixel position offset being applied thereto and then search for extraction a specific pixel group having a total absolute value of respective pixel grayscale difference values falling within the range of threshold $th_1$. In the example of FIG. 8, five pixel groups including the pixel group 13 that contains the target pixel 12 are extracted. Although the 3×3 pixels with the target pixel 12's coordinates $(P_x, P_y)$ as the center are handled as one pixel group 13, this should not be interpreted to limit the scope of the invention and may alternatively be any available pixel groups as far as these contain the coordinates $(P_x, P_y)$ of target pixel 12. Desirably, a pixel group with the target pixel 12's coordinates $(P_x, P_y)$ as the center is preferable. More preferably, a matrix of 3×3 pixels with the target pixel coordinates $(P_x, P_y)$ as its center is set as the pixel group 13. This can be said because if the pixels making up the pixel group are excessively increased in number then it becomes difficult to conduct a search for pixel groups with their grayscale values falling within the threshold $th_1$.

At the variation evaluating step S204 shown in FIG. 1, the probability calculation circuit 320 is responsive to receipt of the under-test workpiece's optical image 20 and the reference image 20, for acquiring a probability value(s) with a chi-square distribution value of the degree of freedom k being less than or equal to a specific value h to be later indicated, based on a plurality of pixel grayscale values of the reference image 10 with the graytone value of the under-test pixel 12 being added to the grayscale value of a pixel corresponding to the test pixel 12 out of the vicinal pixel group as has been searched at the above-stated step and also based on a plurality of grayscale values of the optical image 20 corresponding to the plurality of pixels of reference image 10.

FIG. 9 shows an example of the optical image data corresponding to that of FIG. 8.

In FIG. 9, a pixel of the coordinates (86, 310) having its grayscale value "112" is identified as the under-test pixel 22 in the reference image 10, which pixel corresponds to the test pixel 12. Shown herein are a plurality of pixel groups 23 of the optical image 20, which correspond to the multiple pixel groups of reference image 10 shown in FIG. 8.

Let the pixel grayscale value of optical image 20 at the coordinates (x, y) be represented as g(x,y).

Here, in a region of f(x,y)((x,y)∈{Ai}), grayscale values exhibit no appreciable variations; on the contrary, in g(x,y) ((x,y)∈{Ai}), variations take place. Here, such variations are evaluated for output. An exemplary procedure of this variation evaluation is as follows.

FIG. 10 is a conceptual diagram for explanation of the variation evaluating technique.

The variation of g(x,y)((x,y)∈{Ai}) is evaluated using scattering or dispersion.

A model of a grayscale value Y observed is defined using the modeling equation which follows.

$$Y = X + (a \cdot X + b)\epsilon_1 + \epsilon_2,$$

where, X is the true grayscale value, $(a \cdot X + b)\epsilon_1$ is a model equation indicative of optical image noises, "a" and "b" are parameters indicating optical image noises, $\epsilon_1$ is a probability variable in conformity with the normal distribution of the average "0" and dispersion "1," and $\epsilon_2$ is a probability variable indicating a difference or discrepancy occurring due to the presence of a defect(s).

The above-noted model equation is applied to the pixel grayscale value g(x,y) of optical image 20, thereby defining the model of g(x,y) in a way indicated by Equation 2 which follows.

$$g(x,y) = f(x,y) + (a f(px, py) + b)\epsilon_1 + \epsilon_2. \quad (EQU2)$$

Here, the parameters a and b are set to a=1/180 and b=1.

The probability calculator circuit 320 calculates the sample value h of chi($\chi$)-square distribution by using Equation 3 below.

Equation 3 is defined in a way which follows. The number of identical vicinal pattern elements is given as k. In the example of FIG. 8, a total of five pixel groups, including the pixel group 13 containing the test pixel 12, are extracted, so k=5.

$$h = \frac{\sum_{(x,y) \in \{Ai\}} \{g(x, y) - f(x, y)\}^2}{\{a \cdot f(p_x, P_y) + b\}^2}$$

The value h thus obtained by such calculation is expected to afford the chi-square distribution of freedom degree k if defects are absent. Hence, in this embodiment, this chi-square distribution is used to acquire the probability value as indicated in the case of the freedom k and sample value h.

Figure 11:
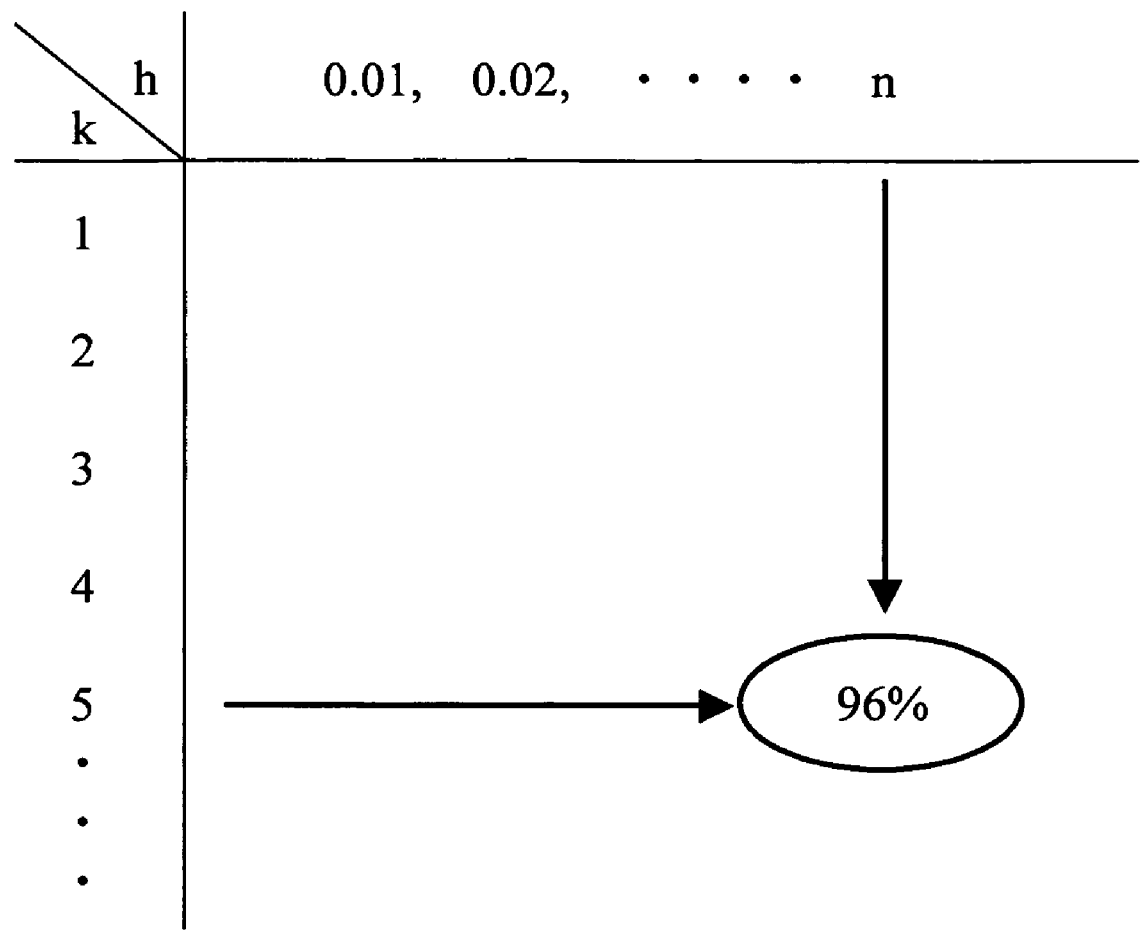
FIG. 11 is a diagram for explanation of a process for acquiring a probability value based on a chi-square distribution.

FIG. 11 is a conceptual diagram for explanation of the process for acquiring the probability value due to the chi-square distribution.

The chi-square distribution data is prestored for example in the magnetic disk device 109, which exemplifies the storage device (storage unit). The probability calculator circuit 320 reads the chi-square distribution data out of the magnetic disk device 109 through the control computer 110, thereby obtaining certain probability value(s) in which the sample value as indicated in the case of the freedom k and sample value h is less than or equal to h. In the example of FIG. 11, when k=5 and h=n, the probability value obtained is 96 percent (%).

As the model indicative of optical image noises is built in Equation 2, the resultant probability is capable of obtaining a variation probability (%) explainable by noise components. In other words, this shows that in case the probability obtained becomes greater in value (i.e., gets nearer to 100%), a difference occurred is not due to the presence of defects.

It should be noted here that the chi-square distribution data may be stored in the form of a correspondence table or in other possible information forms. Although in this embodiment it is stored in the magnetic disk device 109 for later readout via the bus 120 into the comparator circuit 108, this comparator 108 is modifiable to have a built-in storage unit.

At the defect judging step S206 of FIG. 1, the defect determination circuit 330 is responsive to receipt of the probability value thus obtained, for using this value to determine whether defects are present in the under-test pixel 22 of the optical image corresponding to the pixel 12 being tested. Specifically, compare the probability value to a predefined threshold $th_2$: if the probability value is larger than the threshold $th_2$, then determine that no defects are present (OK); if the former is less than the latter then judge defects must be present (NG).

By performing in this way the calculation using the grayscale values of the pixel groups of the reference image and optical image without the use of any shape-prematched filters, it is possible to provide enhanced processability of various angled pattern edges and those edges having complicated profiles.

Figure 12:
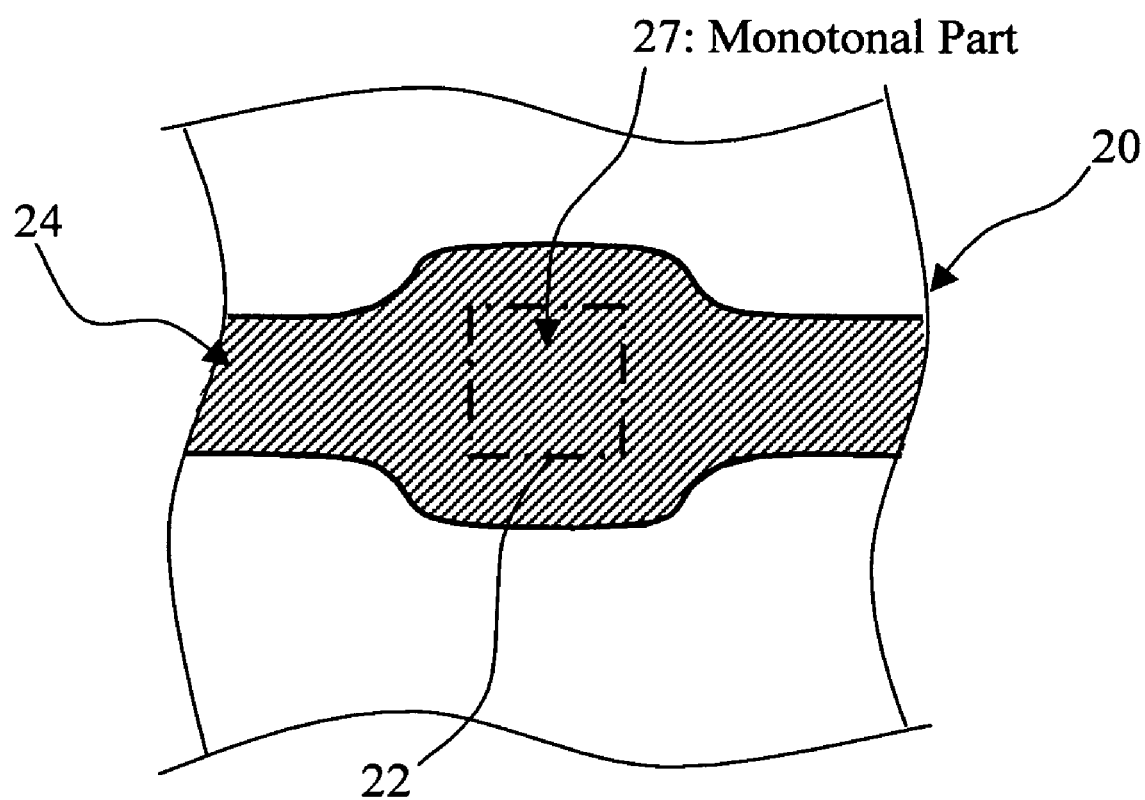
FIG. 12 shows another example of the optical image.

FIG. 12 shows another example of the optical image.

As previously stated, performing calculations using the reference/optical image pixel group grayscale values rather than the shape-prematched filters makes it possible to perform the optical/reference image comparison even in case where the optical image 20 has a solid graytone or "painted" portion 27 with inherently unidentifiable contour lines such as shown in FIG. 12, which is chosen as the under-test pixel 22. Similarly the optical/reference image comparison capability is achievable even in the case of gently sloped edges having difficulties in identification of their contour lines.

It is thus demonstrated that whereas the prior art processing schemes using pattern shape-prematched filters are difficult to optimize such filters in case the optical system is changed, this embodiment offers an ability to readily perform optimization of parameters and expansion of noise models even in cases where the optics is modified for example. This is because the embodiment is specifically arranged to permit the optical image noise model to be directly reflected on the calculation equation(s)—in other words, accommodates it positively.

In addition, the prior art filtering processing requires differential (difference) computation, which is hardly executable without accompanying risks of appreciable errors. In contrast, this embodiment is capable of reducing or minimizing such errors since such unstable differential processing is no longer required.

Furthermore, the prior art filter processing is unclear as to what is exactly meant by an output value that is a final result. When changing the threshold for comparison, it has been difficult to perform threshold adjustment for a certain purpose. This embodiment, by contrast, is capable of making it easier to adjust the threshold for such purpose, because its output value indicative of the final result is a variation probability (%) which is explainable by noise components.

Figure 13:
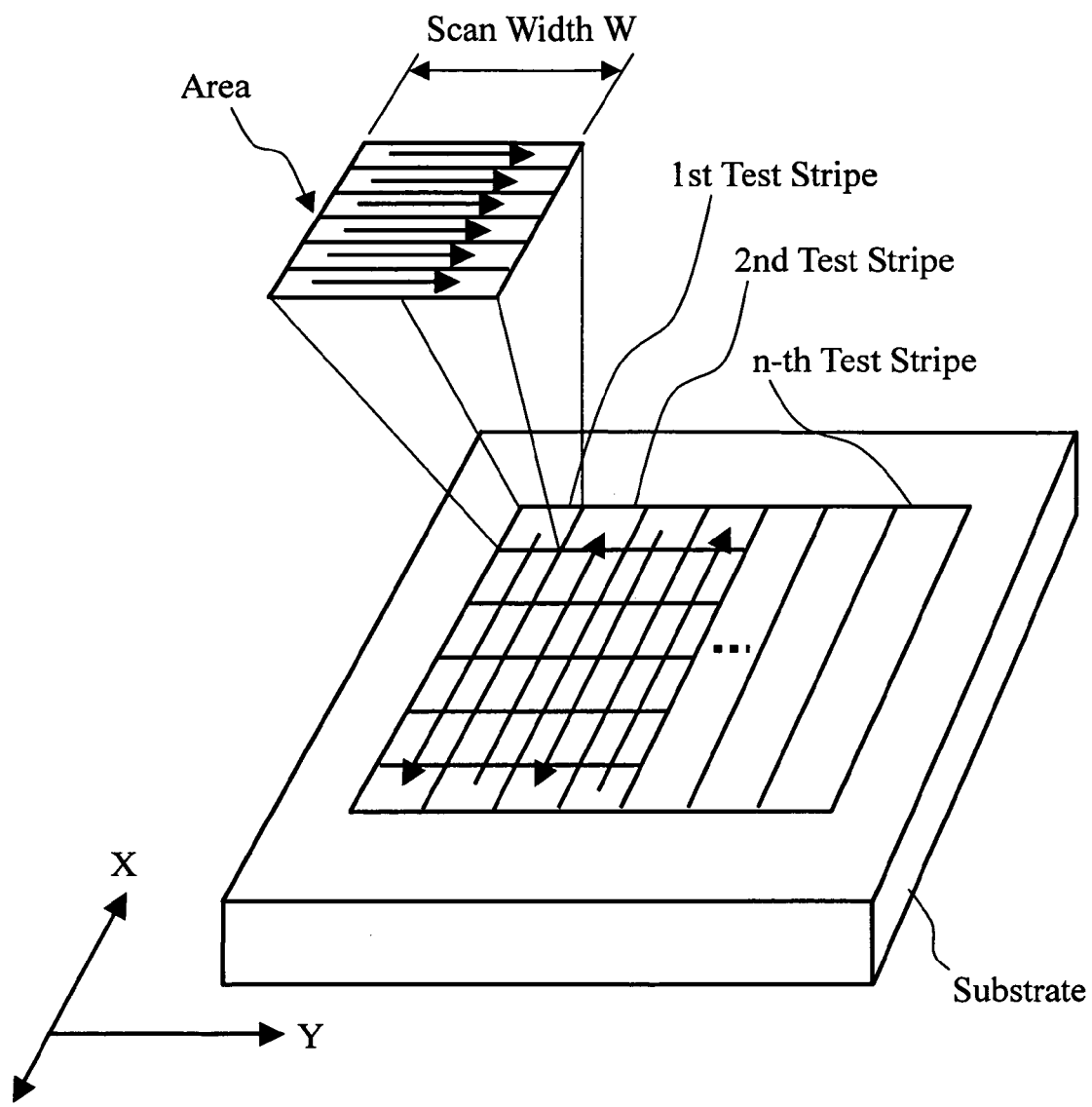
FIG. 13 is a perspective view of a substrate being tested for explanation of another optical image acquisition scheme.

FIG. 13 is a diagram for explanation of another optical image acquisition technique.

Although the arrangement of FIG. 2 uses the PD array 105 for simultaneous incoming radiation of a specified number of pixels (e.g., 2,048 pixels) having the scan width W, the invention is not limited thereto and may alternatively employ a scheme for acquiring 2D images in units of areas with a prespecified size, by scanning a laser beam using a laser scan optical device (not shown) in the Y direction upon every detection of a fixed pitch of movement at a laser interferometer while sending the XYθ table 102 in the X direction at a constant speed and then detecting transmitted light in a way shown in FIG. 13.

As apparent from the foregoing, this embodiment is arranged to employ the grayscale values of a plurality of pixel groups including a pixel group that contains therein a specific pixel under inspection, so it is possible to offer increased processability regardless of pattern shapes. It is also possible to acquire a highly reliable probability value from variations or fluctuations of the grayscale values of multiple pixel groups. This high reliable probability value acquirability in turn makes it possible to achieve workpiece pattern inspection with increased reliability.

System elements which are expressed by the terms "circuits" or "steps" in the description above may be arranged by computer-executable software programs. When the need arises, these may alternatively be implemented not only by software programs but also by use of hardware and software combinations. Similar results are also obtainable by designing them in a combination with firmware. In the case of the arrangement using programs, the programs are prestored in nondestructive recording media, such as magnetic disks, magnetic tapes, floppy diskettes (FDs), read-only memories (ROMs) or equivalents thereto. For example, those circuits making up the arithmetic control unit in the workpiece inspection apparatus 100—namely, the table control circuit 114, reference circuit 112, comparator circuit 108, etc.—may be configured from electrical circuitry or alternatively realized in the form of software programs capable of being executed by the control computer 110. Still alternatively, these circuits may be implemented in the form of combinations of electrical circuitry and software programs.

While this invention has been particularly shown and described with reference to specific embodiments, the invention should not exclusively be limited thereto. For instance in each embodiment reflected light in place of the transmitted light or alternatively employ both the transmitted light and reflected light at a time may be used. Although the reference image for use as the under-test pattern data is produced from the design data, similar results are obtainable by using the data of identical pattern as sensed or "captured" by an image sensor including a PD array or else. In other words, similar results are obtainable irrespective of whether the embodiment is applied to die-to-die inspection or die-to-database inspection. In the case of the die-to-die inspection, one of a couple of optical images is used as an object under defect inspection whereas the other is acquired as the reference image at the step S104 in FIG. 1. The workpiece being tested is not limited to masks and may alternatively be others as far as these have pixels for comparison.

Additionally, although detailed explanations are omitted as to those components which are not specifically required for the description of this invention, such as device configuration and control schemes or else, it is possible to selectively use any required device configurations and control schemes on a case-by-case basis.

It should be appreciated that for miscellaneous matters, any variants of the workpiece inspection apparatus and methodology are construed to be involved in the scope of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A workpiece inspection apparatus, comprising:
a search unit configured to input a reference image and to search the input reference image for a first group of pixels containing therein a first pixel and a second group of pixels having grayscale values within a predetermined threshold;
a memory that stores the reference image;
a probability acquisition unit configured to receive an optical image of a workpiece being tested and said reference image, to calculate a sample value h of a chi-square distribution by using a grayscale value of said first pixel in said reference image and a grayscale value of a second pixel corresponding to said first pixel in the second pixel group searched, a grayscale value of a third pixel of said optical image corresponding to said first pixel in said reference image, and a grayscale value of a fourth pixel of said optical image corresponding to said second pixel in said second pixel group corresponding to said first pixel, and to acquire a probability value by using said sample value h of said chi-square distribution; and
a determination unit configured to use said probability value to determine whether a defect is present at the third pixel of said optical image corresponding to said first pixel,
wherein said sample value h of said chi-square distribution is calculated by solving a following equation using the grayscale value $f(P_x, P_y)$ of said first pixel, a grayscale value $g(x, y)$ of said optical image at coordinates $(x, y)$, a grayscale value $f(x, y)$ of said reference image at coordinates $(x, y)$, a string of dots $\{Ai\}$ of coordinates of said first pixel and said second pixel in the second pixel group searched, and parameters a and b, $$h = \frac{\sum_{(x,y)\in\{Ai\}} \{g(x, y) - f(x, y)\}^2}{\{a \cdot f(p_x, p_y) + b\}^2}.$$

2. The apparatus according to claim 1, wherein said probability acquisition unit acquires said probability value by use of a chi-square distribution.

3. The apparatus according to claim 2, wherein said probability acquisition unit obtains said probability value using a model equation indicative of noise components of said optical image.

4. A computer-readable recording medium storing therein a computer program for causing a computer to execute a process comprising:

storing in a first storage device a reference image of a workpiece being tested;

reading out of said first storage device the reference image and searching said reference image for a first group of pixels containing therein a first pixel and a second group of pixels having grayscale values within a predetermined threshold;

storing in a second storage device an optical image of said workpiece; reading out of said second storage device the optical image, calculating a sample value h of a chi-square distribution by using a grayscale value of said first pixel in said reference image and a grayscale value of a second pixel corresponding to said first pixel in the second pixel group searched, a grayscale value of a third pixel of said optical image corresponding to said first pixel in said reference image, and a grayscale value of a fourth pixel of said optical image corresponding to said second pixel in said second pixel group corresponding to said first pixel, and acquiring a probability value by using said sample value h of said chi-square distribution; and using said probability value to determine whether a defect is present at the pixel of said optical image corresponding to said first pixel, wherein said sample value h of said chi-square distribution is calculated by solving a following equation using the grayscale value $f(P_x, P_y)$ of said first pixel, a grayscale value $g(x, y)$ of said optical image at coordinates $(x, y)$, a grayscale value $f(x, y)$ of said reference image at coordinates $(x, y)$, a string of dots $\{Ai\}$ of coordinates of said first pixel and said second pixel in the second pixel group searched, and parameters a and b, $$h = \frac{\sum_{(x,y)\in\{Ai\}} \{g(x, y) - f(x, y)\}^2}{\{a \cdot f(p_x, p_y) + b\}^2}.$$

5. The apparatus according to claim 1, wherein each of the first and second pixel groups includes a matrix of three rows and three columns of pixels.

6. The apparatus according to claim 3, wherein said determination unit compares said probability value to a prespecified threshold.

7. The apparatus according to claim 6, wherein said determination unit determines that said pixel is normal when said probability value thus obtained is greater than said prespecified threshold.

8. The apparatus according to claim 6, wherein said determination unit determines said pixel is defective when said probability value thus obtained is less than or equal to said threshold.

* * * * *